(12) United States Patent
Huang

(10) Patent No.: US 9,679,887 B1
(45) Date of Patent: Jun. 13, 2017

(54) OVER-VOLTAGE PROTECTION CIRCUIT

(71) Applicant: TAIWAN SEMICONDUCTOR MANUFACTURING CO., LTD., Hsinchu (TW)

(72) Inventor: Tien-Chien Huang, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/171,950

(22) Filed: Jun. 2, 2016

(51) Int. Cl.
*H01L 27/02* (2006.01)
*H01L 29/06* (2006.01)

(52) U.S. Cl.
CPC ...... *H01L 27/0266* (2013.01); *H01L 29/0611* (2013.01)

(58) Field of Classification Search
CPC ............. H01L 27/0266; H01L 27/0248; H01L 29/66795
See application file for complete search history.

(56) References Cited

U.S. PATENT DOCUMENTS

| | | | |
|---|---|---|---|
| 8,487,378 B2 | 7/2013 | Goto et al. | |
| 8,729,634 B2 | 5/2014 | Shen et al. | |
| 8,826,213 B1 | 9/2014 | Ho et al. | |
| 8,847,284 B2 * | 9/2014 | Yang | H01L 27/0207 257/207 |
| 8,887,106 B2 | 11/2014 | Ho et al. | |
| 8,943,455 B2 * | 1/2015 | Chen | G06F 17/5081 716/110 |
| 9,053,283 B2 * | 6/2015 | Chen | G06F 17/5081 |
| 9,122,833 B2 * | 9/2015 | Chen | G06F 17/5081 |
| 9,176,479 B2 * | 11/2015 | Hsieh | G04F 10/005 |
| 9,412,818 B2 * | 8/2016 | Yang | H01L 21/823431 |
| 9,466,493 B2 * | 10/2016 | Chen | H01L 21/28008 |
| 9,495,506 B2 * | 11/2016 | Chen | G06F 17/5081 |
| 9,496,363 B1 * | 11/2016 | Chang | H01L 29/515 |
| 2014/0282326 A1 | 9/2014 | Chen et al. | |

* cited by examiner

*Primary Examiner* — Evan Pert
(74) *Attorney, Agent, or Firm* — Maschoff Brennan

(57) ABSTRACT

A device is disclosed that includes a first transistor, a second transistor, and a first PODE device. The second transistor is electrically coupled to the first transistor. The first PODE device is adjacent to a drain/source region of the second transistor. A control end of the first PODE device is electrically coupled to a drain/source end of the second transistor.

20 Claims, 5 Drawing Sheets

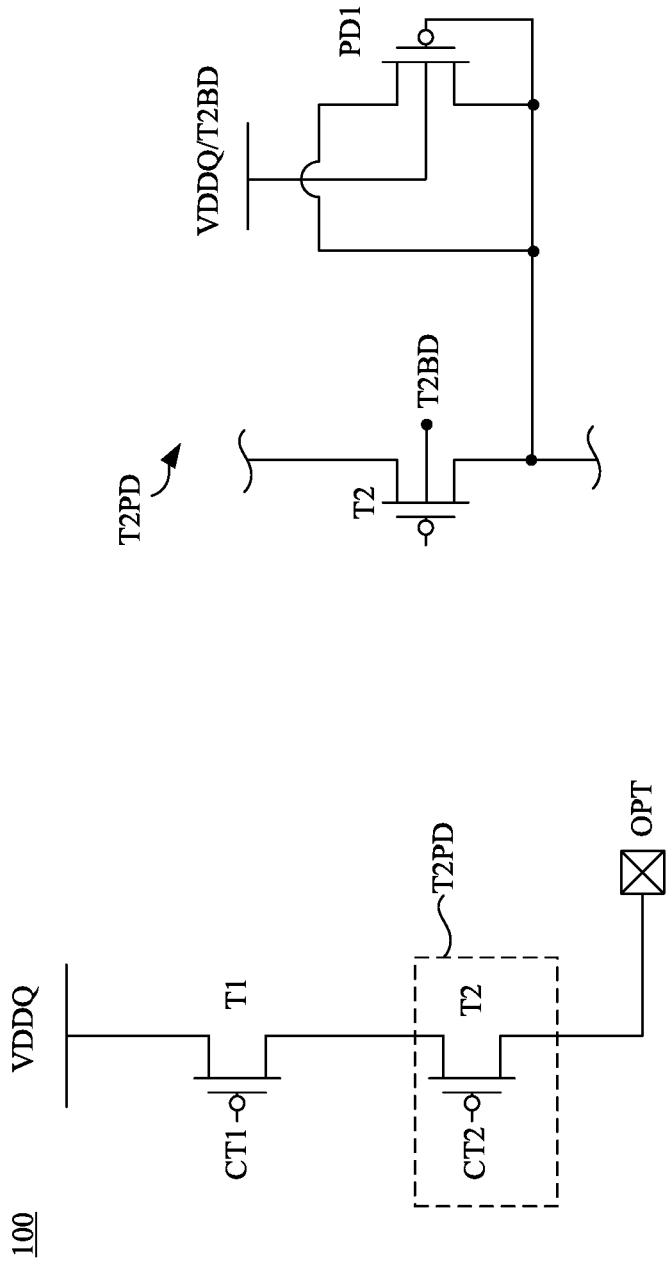

OVER-VOLTAGE PROTECTION CIRCUIT

BACKGROUND

A circuit typically includes a number of components including, for example, transistors and passive components. In that circuit, a transistor breaks down when receiving an over voltage. Thus, an over-voltage protection circuit configured to prevent the transistors in the circuit from receiving over voltages is used.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A is a schematic diagram of an over-voltage protection circuit, in accordance with some embodiments of the present disclosure.

FIG. 1B is an equivalent circuit diagram of an equivalent transistor in FIG. 1A in accordance with some embodiments of the present disclosure.

DETAILED DESCRIPTION

Figure 1C:
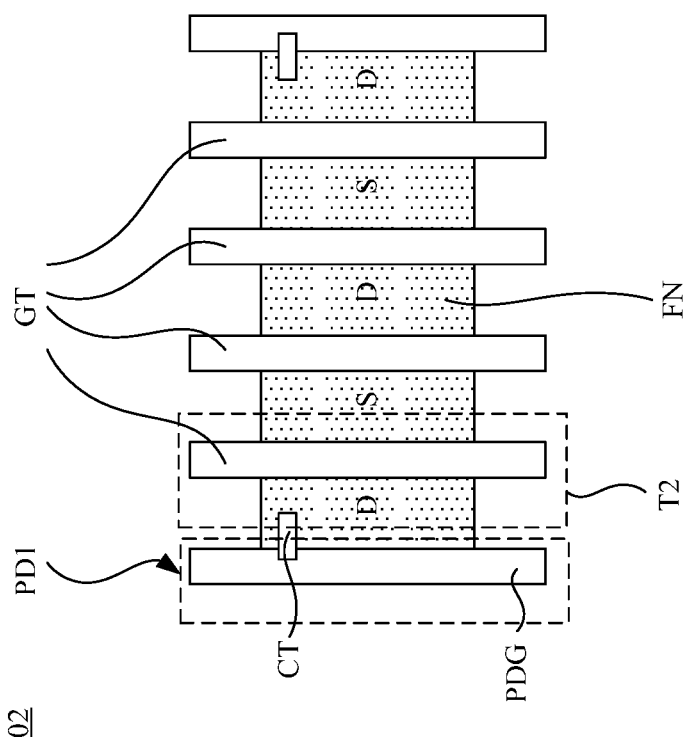
FIG. 1C is a schematic layout in a Fin Field-Effect Transistor (FinFET) structure including structures corresponding to the transistor with a PODE device in FIG. 1B in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Reference is made to FIG. 1A. FIG. 1A is a schematic diagram of an over-voltage protection circuit 100, in accordance with some embodiments of the present disclosure.

As illustratively shown in FIG. 1A, the over-voltage protection circuit 100 includes a transistor T1 and an equivalent transistor T2PD including a transistor T2 with an equivalent polys on OD edge (PODE) device PD1 (equivalently shown in FIG. 1B). In some embodiments, the transistor T1 is a P-type transistor having a source end, a drain end, and a gate end. The source end of the transistor T1 is electrically coupled to a voltage source having a voltage level VDDQ, for example, 1.2 volts. The drain end of the transistor T1 is electrically coupled to the transistor T2, and the gate end of the transistor T1 is configured to receive a control signal CT1. In some embodiments, the voltage level of the control signal CT1 is varied between the voltage level VDDQ and the voltage level VDDQ minus a voltage level VDD, for example, VDD=0.8 volts. The voltage level of the control signal CT1 described above is given for illustrative purposes. Various voltage levels of the control signal CT1 are within the contemplated scope of the present disclosure.

In some embodiments, the transistor T2 is a P-type transistor having a source end, a drain end, and a gate end. The source end of the transistor T2 is electrically coupled to the drain end of the transistor T1, the drain end of the transistor T2 is electrically coupled to the equivalent PODE device PD1 (as illustrated in FIG. 1B) and an output end OPT of the over-voltage protection circuit 100, and the gate end of the transistor T2 is configured to receive a control voltage CT2. In some embodiments, the control voltage CT2 is a variable voltage. In some other embodiments, the control voltage CT2 is a fixed voltage.

In various embodiments, the voltage level of the control voltage CT2 is varied between the voltage level VDDQ and the voltage level VDDQ minus the voltage level VDD, but is not limited in this regard. In alternative embodiments, the voltage level of the control voltage CT2 is the voltage level VDDQ minus the voltage level VDD. Various voltage levels of the control voltage CT2 are within the contemplated scope of the present disclosure.

For illustration, when the gate end of the transistor T2 receives a voltage with, for example, 0.4 volts, an operating voltage of the source end of the transistor T2 is clamped at a voltage level equal to 0.4 volts plus $Vth\_T2$, in which $Vth\_T2$ indicates a threshold voltage of the transistor T2. With such a configuration, a voltage difference of the source end and drain end of the transistor T1 is able to be kept within the breakdown voltage, for example, 0.8 volts of the transistor T1, so as to prevent the transistor T1 from breaking down. Effectively, the transistor T2 is operated as a protection transistor.

In this document, the terms "comprise" or "comprising," "include" or "including," "have" or "having," and the like used in this document are to be understood to be open-ended, i.e., to mean including but not limited to.

In addition, when an element is referred to as being "electrically coupled" to another element, it can be directly coupled or coupled to the other element, or intervening elements may be present. Moreover, "electrically connect" can further be referred to as the interoperation or interaction between two or more elements.

Reference is also made to FIG. 1B. FIG. 1B is an equivalent circuit diagram of the equivalent transistor T2PD in FIG. 1A, in accordance with some embodiments of the present disclosure. For illustration in FIG. 1B, the equivalent transistor T2PD includes the transistor T2 and the equivalent PODE device PD1. The equivalent PODE device PD1 is electrically coupled to the drain end of the transistor T2. In some embodiments, the equivalent PODE device PD1 is equivalent to and operated as a transistor, as illustrated in FIG. 1B.

In some embodiments, the equivalent PODE device PD1 is a P-type transistor having a source end, a drain end, a gate end, and a body end. For illustration in FIG. 1B, the source end of the equivalent PODE device PD1 and the drain end of the equivalent PODE device PD1 are electrically coupled to each other, and are electrically coupled to the drain end of the transistor T2. The gate end of the equivalent PODE device PD1 is electrically coupled to the source end of the equivalent PODE device PD1, the drain end of the equivalent PODE device PD1, and the drain end of the transistor T2. The body end of the equivalent PODE device PD1 is electrically coupled to the voltage source having the voltage level VDDQ. In some other embodiments, the body end of the equivalent PODE device PD1 is electrically coupled to a body end T2BD of the transistor T2.

In some approaches, a gate end of PODE device coupled to a protection transistor is electrically coupled to the voltage source with the voltage level VDDQ. In such a configuration, when the voltage level of the drain end of the transistor, coupled to the PODE device, is, for example, 0 volt, the PODE device with a breakdown voltage lower than, for example, 1.2 volts, would be damaged.

Compared to the approaches above, in the present disclosure, the source end, the drain end, and the gate end of the equivalent PODE device PD1 are electrically coupled to a same node, for illustration, the drain end of the transistor T2. Therefore, when the voltage level of the drain end of the transistor T2 is 0 volt, the voltage differences among the source end, the drain end, and the gate end of the equivalent PODE device PD1 would be 0. Accordingly, breakdown of the equivalent PODE device PD1 is prevented.

As discussed above, the source end, the drain end, and the gate end of the equivalent PODE device PD1 are electrically coupled to a same node. Accordingly, a leakage current will not be generated by the equivalent PODE device PD1.

The configurations of the transistor T2 with the equivalent PODE device PD1 in FIG. 1A and FIG. 1B are given for illustrative purposes. Various configurations of the transistor T2 with the equivalent PODE device PD1 are within the contemplated scope of the present disclosure. For example, in some alternative embodiments, the equivalent PODE device PD1 is electrically coupled to the source end of the transistor T2 on a basis of actual requirements.

Reference is also made to FIG. 1C. FIG. 1C is a schematic layout 102 in a Fin Field-Effect Transistor (FinFET) structure including structures corresponding to the transistor T2 with the equivalent PODE device PD1 in FIG. 1B, in accordance with some embodiments of the present disclosure. For simplicity, the schematic layout 102 in FIG. 1C illustrates and labels a portion of the structures corresponding to the transistor T2 with the equivalent PODE device PD1 in FIG. 1B. For simplicity of illustration, only the equivalent PODE device PD1 and the transistor T2 in FIG. 1C are discussed, and the other portions of the schematic layout 102 are not further discussed herein.

In some embodiments, the schematic layout 102 includes an active region FN, gate conductors GT, and the equivalent PODE device PD1. In some embodiments, the active region FN includes one or more fin structures (not shown) for forming, for example, the FinFET. In various embodiments, at least one fin structure is formed on, or formed with, the active region FN. In some embodiments, the term "active region" discussed in the present disclosure is also referred to as "OD" (oxide dimensioned area).

In some embodiments, the active region FN is formed by using semiconductor material. In some other embodiments, the active region FN is formed by using silicon on insulator (SOI) technology.

In some embodiments, the active region FN has at least one source region S and at least one drain region D. For illustration in FIG. 1C, the active region FN has source regions S and drain regions D, in which one source region S and one drain region D are formed at two sides of one gate conductor GT. In some embodiments, the source region S and the drain region D are located at two sides of a channel region (not shown) beneath the gate conductor GT. In some embodiments, the source region S and the drain region D are source doped region and drain doped region, respectively.

In some embodiments, the gate conductor GT is implemented by using polysilicon, metal or doped polysilicon. In some embodiments, the gate conductor GT is formed over the active region FN. In some embodiments, the gate conductor GT, a channel region (not shown) beneath the gate conductor GT, and the source region S and drain regions D at two sides of the gate conductor GT, form a transistor. In such embodiments, the gate conductor GT and the source region S and drain regions D serve as a gate end, a source end, and a drain end of a transistor, respectively.

For illustration in FIG. 1C, the transistor T2 includes a source region S, a drain region D, a gate conductor GT, and the channel region (not shown) beneath the gate conductor GT. The source region S, the drain region D, and the gate conductor GT respectively serve as the source end, the drain end, and the gate end of the transistor T2 as illustrated in FIG. 1B. Moreover, the drain region D of the transistor T2 is adjacent to and electrically coupled to the equivalent PODE device PD1, as illustrated in FIG. 1B.

For further illustration in FIG. 1C, the equivalent PODE device PD1 includes a gate PDG which serves as a gate end of the equivalent PODE device PD1 as illustrated in FIG. 1B. In some embodiments, the gate PDG is implemented by polysilicon or doped polysilicon. In some embodiments, the gate PDG of the equivalent PODE device PD1 is formed over an end, or covers an edge, of the active region FN, as illustrated in FIG. 1C, to protect the end of the active region FN during processing. In some embodiments, the gate PDG of the equivalent PODE device PD1 is a dummy structure in the schematic layout 102.

In some embodiments, the drain region D between the gate PDG and the gate conductor GT of the transistor T2, as shown in FIG. 1C, also serves as a source end and/or a drain end of the equivalent PODE device PD1 as illustrated in FIG. 1B.

In some embodiments, the gate PDG of the equivalent PODE device PD1 is electrically coupled to the drain region D (i.e., the drain end) of the transistor T2 via a conductor CT. In some embodiments, the conductor CT is a local conductive segment which is also referred to as "M0_PO" in some embodiments.

In some embodiments, the conductor CT is an extended portion of the equivalent PODE device PD1, which is coupled to the drain region D of the transistor T2. In some other embodiments, the conductor CT is a butted contact to couple the gate PDG of the equivalent PODE device PD1 and the drain of the transistor T2. In alternative embodiments, the conductor CT couples the gate PDG of the equivalent PODE device PD1 to the drain region D of the transistor T2 through contacts (not shown) and metal layers (not shown). By using the conductor CT, the gate end of the equivalent PODE device PD1 is able to be electrically coupled to the source end and drain end of the equivalent PODE device PD1, as illustrated in FIG. 1B.

The configurations of the equivalent PODE device PD1 adjacent to the drain region D of the transistor T2 in FIG. 1C are given for illustrative purposes. Various configurations of the equivalent PODE device PD1 are within the contemplated scope of the present disclosure. For example, in various embodiments, the equivalent PODE device PD1 is adjacent to the source region S of the transistor T2 on a basis of actual requirements.

In addition, the configurations of the equivalent PODE device PD1 electrically coupled to the drain region D of the transistor T2 in FIG. 1C are given for illustrative purposes. Various configurations of the equivalent PODE device PD1 are within the contemplated scope of the present disclosure. For example, in various embodiments, the equivalent PODE device PD1 is electrically coupled to the source region S of the transistor T2 on a basis of actual requirements.

Figures 2A, 2B:
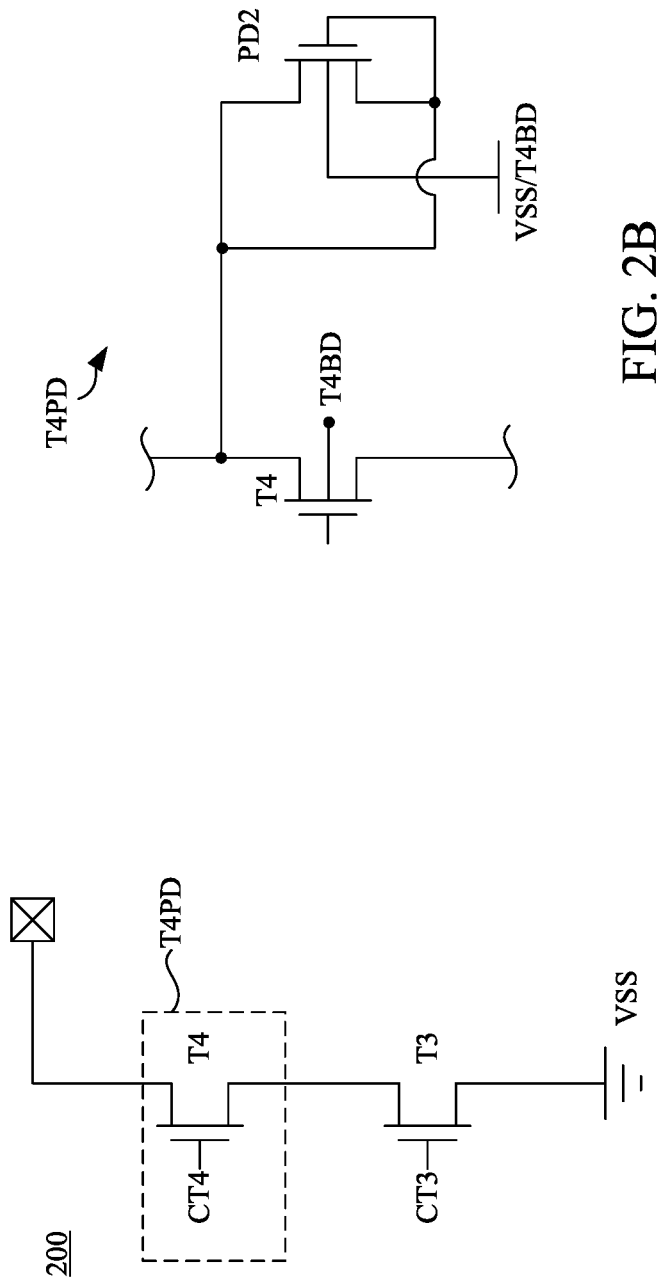
FIG. 2A is a schematic diagram of an over-voltage protection circuit in accordance with some other embodiments of the present disclosure.
FIG. 2B is an equivalent circuit diagram of the equivalent transistor in FIG. 2A, in accordance with some embodiments of the present disclosure.

Reference is made to FIG. 2A. FIG. 2A is a schematic diagram of an over-voltage protection circuit 200, in accordance with some other embodiments of the present disclosure.

In some embodiments, the over-voltage protection circuit 200 includes a transistor T3 and an equivalent transistor T4PD including a transistor T4 with an equivalent PODE device PD2 (equivalently shown in FIG. 2B). In some embodiments, the transistor T3 is an N-type transistor having a source end, a drain end, and a gate end. The source end of the transistor T3 is electrically coupled to a voltage source having a voltage level VSS, for example, 0 volt, the drain end of the transistor T3 is electrically coupled to the transistor T4, and the gate end of the transistor T3 is configured to receive a control signal CT3. In some embodiments, the voltage level of the control signal CT3 is varied between a voltage level VDD and the voltage level VSS. The voltage level of the control signal CT3 described above is given for illustrative purposes. Various voltage levels of the control signal CT3 are within the contemplated scope of the present disclosure.

In some embodiments, the transistor T4 is an N-type transistor having a source end, a drain end, and a gate end. The source end of the transistor T4 is electrically coupled to the drain end of the transistor T3, the drain end of the transistor T4 is electrically coupled to an output end OPT of the over-voltage protection circuit 200, and the gate end of the transistor T4 is configured to receive a control voltage CT4. In some embodiments, the control voltage CT4 is a variable voltage. In some other embodiments, the control voltage CT2 is a fixed voltage.

In various embodiments, the voltage level of the control voltage CT4 is varied between the voltage level VDD and the voltage level VSS, but is not limited in this regard. In alternative embodiments, the voltage level of the control voltage CT4 is the voltage level VDD. Various voltage levels of the control voltage CT4 are within the contemplated scope of the present disclosure.

For illustration, when the gate end of the transistor T4 receives a voltage with, for example, 0.8 volts, an operating voltage of the source end of the transistor T4 is clamped at a voltage level equal to 0.8 volts minus Vth_T4, in which Vth_T4 indicates a threshold voltage of the transistor T4. With such a configuration, a voltage difference of the source end and drain end of the transistor T3 is able to be kept within the breakdown voltage, for example, 0.8 volts of the transistor T3, so as to prevent the transistor T3 from breaking down. Effectively, the transistor T4 is operated as a protection transistor.

Reference is also made to FIG. 2B. FIG. 2B is an equivalent circuit diagram of the equivalent transistor T4PD in FIG. 2A, in accordance with some embodiments of the present disclosure. For illustration in FIG. 2B, the equivalent transistor T4PD includes the transistor T4 and the equivalent PODE device PD2. The equivalent PODE device PD2 is electrically coupled to the drain end of the transistor T4. In some embodiments, the equivalent PODE device PD2 is equivalent to and operated as a transistor.

In some embodiments, the equivalent PODE device PD2 is an N-type transistor having a source end, a drain end, a gate end, and a body end. For illustration in FIG. 2B, the source end of the PODE device PD2 and the drain end of the PODE device PD2 are electrically coupled to each other, and are electrically coupled to the drain end of the transistor T4. The gate end of the PODE device PD2 is electrically coupled to the source end of the PODE device PD2, the drain end of the PODE device PD2, and the drain end of the transistor T4. The body end of the PODE device PD2 is electrically coupled to the voltage source having the voltage level VSS. In some other embodiments, the body end of the equivalent PODE device PD2 is electrically coupled to a body end T4BD of the transistor T4.

In some approaches, a gate end of the PODE device coupled to a protection transistor is electrically coupled to the voltage source with the voltage level VSS. In such a configuration, when the voltage level of the drain end of the transistor coupled to the PODE device is, for example, 1.2 volts, the PODE device with a breakdown voltage lower than, for example, 1.2 volts, would be damaged.

Compared to the approaches above, in the present disclosure, the source end, the drain end, and the gate end of the PODE device PD2 are electrically coupled to a same node, for illustration, the drain end of the transistor T4. Therefore, when the voltage level of the drain end of the transistor T4 is 1.2 volts, the voltage differences among the source end, the drain end, and the gate end of the PODE device PD2 would be 0. Accordingly, breakdown of the PODE device PD2 is prevented.

As discussed above, the source end, the drain end, and the gate end of the PODE device PD2 are electrically coupled to a same node. Accordingly, a leakage current will not be generated by the PODE device PD2.

In some embodiments, the schematic layout of structures corresponding to the transistor T4 and the PODE device PD2 is similar to the schematic layout 102 of structures corresponding to the transistor T2 and the equivalent PODE device PD1, as illustrated in FIG. 1C. Accordingly, the discussion of the schematic layout of structures corresponding to the transistor T4 and the equivalent PODE device PD2 is not further detailed herein.

Figure 3:
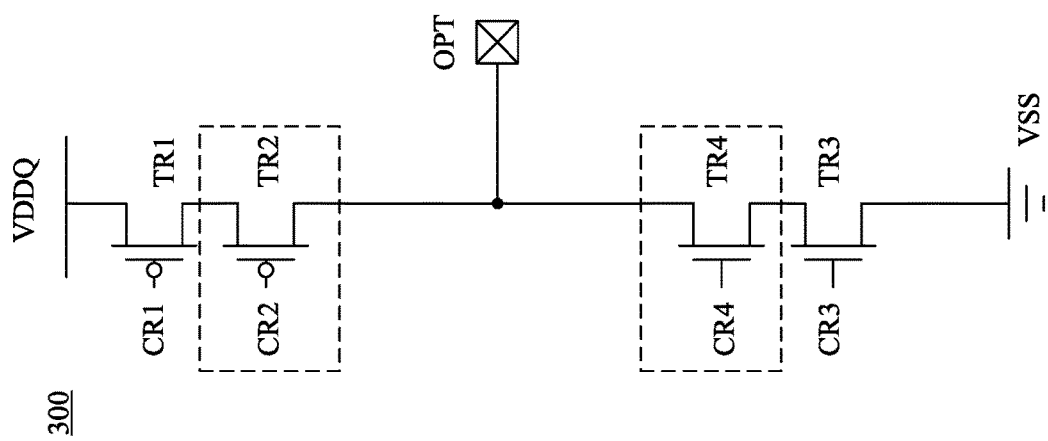
FIG. 3 is a schematic diagram of an over-voltage protection circuit including configurations corresponding to the over-voltage protection circuit in FIG. 1A and the over-voltage protection circuit in FIG. 2A, in accordance with various embodiments of the present disclosure.

Reference is made to FIG. 3. FIG. 3 is a schematic diagram of an over-voltage protection circuit 300 including configurations corresponding to the over-voltage protection circuit 100 in FIG. 1A and the over-voltage protection circuit 200 in FIG. 2A, in accordance with various embodiments of the present disclosure.

In some embodiments, the over-voltage protection circuit 300 includes a transistor TR1, a transistor TR2 with an equivalent PODE device (not shown), a transistor TR3, and a transistor TR4 with an equivalent PODE device (not shown). In some embodiments, the transistors TR1, TR2 are P-type transistors, and the transistors TR3 and TR4 are N-type transistors.

For illustration in FIG. 3, the source end of the transistor TR1 is electrically coupled to a voltage source having a voltage level VDDQ, for example, 1.2 volts, the drain end of the transistor TR1 is electrically coupled to the transistor TR2, and the gate end of the transistor TR1 is configured to receive a first control signal CR1. In some embodiments, the voltage level of the first control signal CR1 is varied between the voltage level VDDQ and the voltage level VDDQ minus a voltage level VDD, for example, 0.8 volts. The voltage level of the first control signal CR1 discussed above is given for illustrative purposes. Various voltage levels of the control signal CR1 are within the contemplated scope of the present disclosure.

For illustration of the transistor TR2, the source end of the transistor TR2 is electrically coupled to the drain end of the transistor TR1, the drain end of the transistor TR2 is electrically coupled to an output end OPT of the over-voltage protection circuit 300, and the gate end of the transistor TR2 is configured to receive a control voltage CR2.

The control voltage CR2 is a variable voltage in some embodiments, or is a fixed voltage in some other embodiments. In various embodiments, the voltage level of the control voltage CR2 is varied between the voltage level VDDQ and the voltage level VDDQ minus the voltage level VDD, but is not limited in this regard. In alternative embodiments, the voltage level of the control voltage CR2 is the voltage level VDDQ minus the voltage level VDD. Various voltage levels of the control voltage CR2 are within the contemplate scope of the present disclosure.

For illustration of the transistor TR3, the source end of the transistor TR3 is electrically coupled to a voltage source having a voltage level VSS, for example, 0 volt, the drain end of the transistor TR3 is electrically coupled to the transistor TR4, and the gate end of the transistor TR3 is configured to receive a second control signal CR3. In some embodiments, the voltage level of the second control signal CR3 is varied between a voltage level VDD, for example, 0.8 volts and the voltage level VSS. The voltage level of the second control signal CR3 discussed above is given for illustrative purposes. Various voltage levels of the control signal CR3 are within the contemplated scope of the present disclosure.

For illustration of the transistor TR4, the source end of the transistor TR4 is electrically coupled to the drain end of the transistor TR3, the drain end of the transistor TR4 is electrically coupled to the output end OPT of the over-voltage protection circuit 300, and the gate end of the transistor TR4 is configured to receive a control voltage CR4.

The control voltage CR4 is a variable voltage in some embodiments, or is a fixed voltage in some other embodiments. In various embodiments, the voltage level of the control voltage CR4 is varied between the voltage level VDD and the voltage level VSS, but is not limited in this regard. In alternative embodiments, the voltage level of the control voltage CR4 is the voltage level VDD. Various voltage levels of the control voltage CR4 are within the contemplate scope of the present disclosure.

For illustration, when the gate end of the transistor TR2 receives a voltage with, for example, 0.4 volts, an operating voltage of the source end of the transistor TR2 is clamped at a voltage level equal to 0.4 volts plus Vth_R2, in which Vth_R2 indicates a threshold voltage of the transistor TR2. In addition, when the gate end of the transistor TR4 receives a voltage with, for example, 0.8 volts, an operating voltage of the source end of the transistor TR4 is clamped at a voltage level equal to 0.8 volts minus Vth_R4, in which Vth_R4 indicates a threshold voltage of the transistor TR4.

With such a configuration, voltage difference of the source end and drain end of each one of the transistors TR1, TR3 is able to be kept within the breakdown voltages, for example, 0.8 volts of the transistors TR1 and TR3, to prevent the transistors TR1, TR3 from breaking down. Effectively, the transistor TR2 and TR4 are operated as protection transistors.

In some embodiments, the transistor TR2 with the equivalent PODE device (not shown) in FIG. 3 have circuit configurations corresponding to those illustrated in FIG. 1B. Accordingly, the circuit configurations of the transistor TR2 with the equivalent PODE device are not further detailed herein.

Correspondingly, in some embodiments, the transistor TR4 with the equivalent PODE device (not shown) in FIG. 3 have circuit configurations corresponding to those illustrated in FIG. 2B. Accordingly, the circuit configurations of the transistor TR4 with the equivalent PODE device are not further detailed herein.

In some embodiments, the schematic layout of structures corresponding to the transistor TR2 with the equivalent PODE device is similar to the schematic layout 102 of structures corresponding to the transistor T2 and the equivalent PODE device PD1 as illustrated in FIG. 1C. Accordingly, the schematic layout of structures corresponding to the transistor TR2 and the equivalent PODE device is not further detailed herein.

Correspondingly, in some embodiments, the schematic layout of structures corresponding to the transistor TR4 with the equivalent PODE device is similar to the schematic layout 102 of structures corresponding to the transistor T2 and the equivalent PODE device PD1 as illustrated in FIG. 1C. Accordingly, the schematic layout of structures corresponding to the transistor TR4 and the equivalent PODE device is not further detailed herein.

In such a configuration, no matter the voltage level of the drain end of the transistor TR2 or the transistor TR4 is 0 volt or 1.2 volts, the voltage differences among the source end, the drain end, and the gate end of the PODE device would be 0 because the source end, the drain end, and the gate end of the PODE device are electrically coupled to each other, as discussed above. Accordingly, the PODE device electrically coupled to the transistor TR2, or the transistor TR4, is kept safe from being damaged.

As discussed above, the source end, the drain end, and the gate end of the PODE device that is electrically coupled to the transistor TR2, or the transistor TR4, are electrically coupled to a same node in some embodiments. Accordingly, a leakage current of the PODE device electrically coupled to the transistor TR2, or the transistor TR4, will not be generated.

Figure 4:
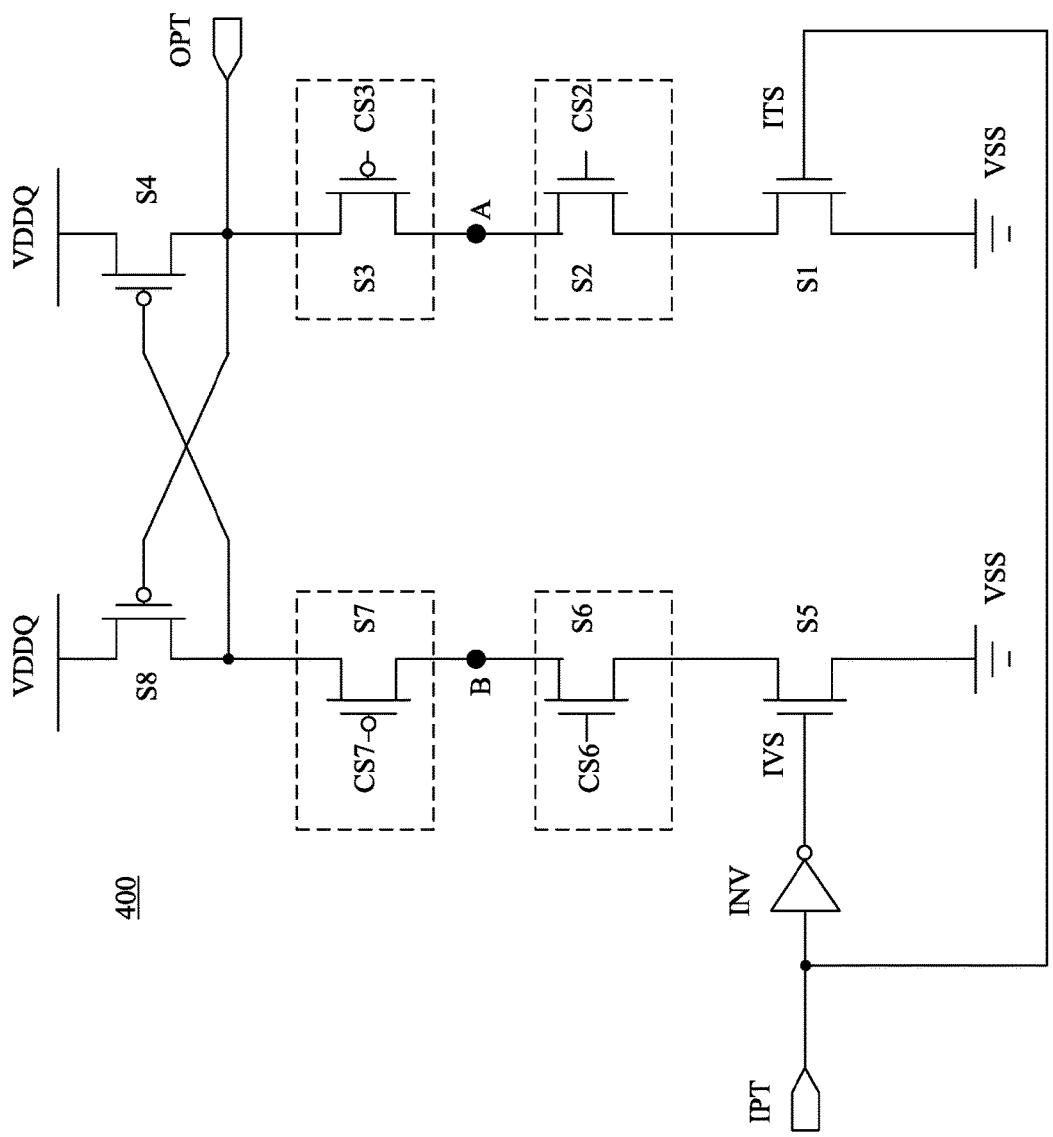
FIG. 4 is a schematic diagram of an over-voltage protection circuit, in accordance with alternative embodiments.

Reference is made to FIG. 4. FIG. 4 is a schematic diagram of an over-voltage protection circuit 400, in accordance with alternative embodiments of the present disclosure.

For illustration in FIG. 4, the over-voltage protection circuit 400 includes a transistor S1, a transistor S2 with a PODE device (not shown), a transistor S3 with a PODE device (not shown), a transistor S4, a transistor S5, a transistor S6 with a PODE device (not shown), a transistor S7 with a PODE device (not shown), a transistor S8, and an inverter INV. In some embodiments, the transistors S1, S2, S5, S6 are N-type transistors, and the transistors S3, S4, S7, S8 are P-type transistors.

For illustration, the transistor S1 is electrically coupled between the transistor S2 and a voltage source with the voltage level VSS, and is configured to receive an input signal ITS. The transistor S2 is electrically coupled in cascade with the transistor S1. The transistor S3 is electrically coupled between an output end OPT of the over-voltage protection circuit 400 and the transistor S2. The transistor S4 is electrically coupled in cascade with the transistor S3, and is electrically coupled between the output end OPT of the over-voltage protection circuit 400 and a voltage source with the voltage level VDDQ.

In some embodiments, the inverter INV is configured to receive the input signal from an input end IPT of the over-voltage protection circuit 400, and is configured to output an inverted input signal IVS to control the transistor S5.

For further illustration, the transistor S5 is electrically coupled between the transistor S6 and the voltage source with the voltage level VSS, and is configured to receive the inverted input signal IVS. The transistor S6 is electrically coupled in cascade with the transistor S5. The transistor S7 is electrically coupled between a gate end of the transistor S4 and the transistor S6. The transistor S8 is electrically coupled in cascade with the transistor S7, and is electrically coupled between the gate of the transistor S4 and the voltage source with the voltage level VDDQ, and is configured to receive the output signal from the output end OPT.

For illustration of operation, when the gate end of the transistor S3 receives the a control voltage CS3 with, for example, 0.4 volts, the operating voltage of the source end of the transistor S3 is clamped at a voltage level equal to 0.4 volts plus Vth_S3, in which Vth_S3 indicates a threshold voltage of the transistor S3. When the gate end of the transistor S7 receives a control voltage CS7 with, for example, 0.4 volts, the operating voltage of the source end of the transistor S7 is clamped at voltage level equal to 0.4 volts plus Vth_S7, in which Vth_S7 indicates a threshold voltage of the transistor S7. When the gate end of the transistor S2 receives a control voltage CS2 with, for example, 0.8 volts, operating voltage of the source end of the transistor S2 is clamped at voltage level equal to 0.8 volts minus Vth_S2, in which Vth_S2 indicates a threshold voltage of the transistor S2. When the gate end of the transistor S6 receives a control voltage CS6 with, for example, 0.8 volts, operating voltage of the source end of the transistor S6 is clamped at voltage level equal to 0.8 volts minus Vth_S6, in which Vth_S6 indicates a threshold voltage of the transistor S6.

With such a configuration in FIG. 4, the voltage difference of the source end and drain end of each one of the transistors S1, S4, S5, S8 is able to be kept within the breakdown voltages of the transistors S1, S4, S5, S8, as discussed above, to prevent the transistors S1, S4, S5, S8 from breaking down. Effectively, the transistors S2, S3, S6, S7 are operated as protection transistors.

In some embodiments, the transistor S3 with the equivalent PODE device (not shown) in FIG. 4 have circuit configurations corresponding to those illustrated in FIG. 1B. Accordingly, the circuit configurations of the transistor S3 with the equivalent PODE device are not further detailed herein. In some embodiments, the transistor S7 with the equivalent PODE device (not shown) in FIG. 4 also have circuit configurations corresponding to those illustrated in FIG. 1B. Accordingly, the circuit configurations of the transistor S7 with the equivalent PODE device are not further detailed herein.

Correspondingly, in some embodiments, the transistor S2 with the equivalent PODE device (not shown) in FIG. 4 have circuit configurations corresponding to those illustrated in FIG. 2B. Accordingly, the circuit configurations of the transistor S2 with the equivalent PODE device are not further detailed herein. In some embodiments, the transistor S6 with the equivalent PODE device (not shown) in FIG. 4 also have circuit configurations corresponding to those illustrated in FIG. 2B. Accordingly, the circuit configurations of the transistor S6 with the equivalent PODE device are not further detailed herein.

In such a configuration in FIG. 4, when the drain ends of the transistors S2, S3, S6, S7, which, for illustration, are labeled as nodes A and B, have varying voltage levels, the voltage difference among the source end, the drain end, and the gate end of each one of the equivalent PODE devices with the transistors S2, S3, S6, S7 would be 0. Accordingly, the equivalent PODE devices with the transistors S2, S3, S6, S7 are kept from breaking down.

As discussed above, the source end, the drain end, and the gate end of the PODE device that is electrically coupled to one of the transistors S2, S3, S6, S7 are electrically coupled to a same node in some embodiments. Accordingly, a leakage current of the PODE device electrically coupled to one of the transistors S2, S3, S6, S7 will not be generated.

In some embodiments, a device is disclosed that includes a first transistor, a second transistor, and a first PODE device. The second transistor is electrically coupled to the first transistor. The first PODE device is adjacent to a drain/source region of the second transistor. A control end of the first PODE device is electrically coupled to a drain/source end of the second transistor.

Also disclosed is a device that includes an over-voltage protection circuit. The over-voltage protection circuit includes a first protection transistor with a first PODE device, wherein a control end of the first PODE device is electrically coupled to a drain/source end of the first protection transistor.

Also disclosed is a device that includes a first transistor, a second transistor, a third transistor, a fourth transistor, a fifth transistor, a sixth transistor, a seventh transistor, an eighth transistor, and at least one PODE device. The first transistor is configured to receive an input signal. The second transistor is electrically and serially coupled to the first transistor. The third transistor is electrically coupled between an output end of the device and the second transistor. The fourth transistor is electrically coupled between the output end of the device and a voltage source. The fifth transistor is configured to receive an inverted input signal. The sixth transistor is electrically and serially coupled to the fifth transistor. The seventh transistor is electrically coupled between a control end of the fourth transistor and the sixth transistor. The eighth transistor is electrically coupled between the seventh transistor and the voltage source, in which a control end of the eighth transistor is electrically coupled to the output end of the device. The at least one PODE device is adjacent to a drain/source region of at least one of the second transistor, the third transistor, the sixth transistor, and the seventh transistor, in which a control end of the at least one PODE device is electrically coupled to a drain/source region end of the at least one of the second transistor, the third transistor, the sixth transistor, and the seventh transistor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
a first transistor;
a second transistor electrically coupled to the first transistor; and
a first polys on OD edge (PODE) device adjacent to a drain/source region of the second transistor, wherein a control end of the first PODE device is electrically coupled to a drain/source end of the second transistor.

2. The device as claimed in claim 1, wherein a source end and a drain end of the first PODE device is electrically coupled to each other.

3. The device as claimed in claim 1, wherein a source end and a drain end of the first PODE device are electrically coupled to a control end of the PODE device.

4. The device as claimed in claim 1 further comprising:
a conductor coupling a gate of the first PODE device to the drain/source end of the second transistor.

5. The device as claimed in claim 1, wherein a source end of the first transistor is electrically coupled to a voltage source, a drain end of the first transistor is electrically coupled to the source end of the second transistor, a drain end of the second transistor is electrically coupled to an output end of the device.

6. The device as claimed in claim 1 further comprising:
a third transistor, wherein a source end of the third transistor is electrically coupled to a voltage source; and
a fourth transistor, wherein a source end of the fourth transistor is electrically coupled to a drain end of the third transistor, and a drain end of the fourth transistor is electrically coupled to an output end of the device and the drain end of the second transistor.

7. The device as claimed in claim 6 further comprising:
a second PODE device adjacent to a drain/source region of the fourth transistor, wherein a control end of the second PODE device is electrically coupled to a drain end of the fourth transistor.

8. The device as claimed in claim 6, wherein the first transistor and the second transistor are transistors of a first type, and the third transistor and the fourth transistor are transistors of a second type.

9. A device comprising:
an over-voltage protection circuit comprising:
a first protection transistor with a first PODE device, wherein a control end of the first PODE device is electrically coupled to a drain/source end of the first protection transistor.

10. The device as claimed in claim 9, wherein a source end and a drain end of the first PODE device is electrically coupled to each other.

11. The device as claimed in claim 9, wherein a source end and a drain end of the first PODE device are electrically coupled to the control end of the first PODE device.

12. The device as claimed in claim 9 further comprising:
a conductor configured to electrically connect a gate of the first PODE device to the drain/source end of the first protection transistor.

13. The device as claimed in claim 9, wherein the over-voltage protection circuit further comprises:
a first transistor, wherein a source end of the first transistor is electrically coupled to a first voltage source; wherein a source end of the first protection transistor is electrically coupled to the drain end of the first transistor, a drain end of the first protection transistor is electrically coupled to an output end of the over-voltage protection circuit.

14. The device as claimed in claim 9, wherein the over-voltage protection circuit further comprises:
a second transistor; and
a second protection transistor with a second PODE device, wherein the second protection transistor is electrically and serially coupled to the first transistor, the first protection transistor, and the second transistor, and a control end of the second PODE device is electrically coupled to a drain/source end of the second protection transistor.

15. The device as claimed in claim 14, wherein a source end of the second transistor is electrically coupled to a second voltage source, a drain end of the second transistor is electrically coupled to the source end of the second protection transistor, a drain end of the second protection transistor is electrically coupled to the output end of the over-voltage protection circuit and the drain end of the first protection transistor.

16. A device comprising:
a first transistor configured to receive an input signal;
a second transistor electrically and serially coupled to the first transistor;
a third transistor electrically coupled between an output end of the device and the second transistor;
a fourth transistor electrically coupled between the output end of the device and a voltage source;
a fifth transistor configured to receive an inverted input signal;
a sixth transistor electrically and serially coupled to the fifth transistor;
a seventh transistor electrically coupled between a control end of the fourth transistor and the sixth transistor;
an eighth transistor electrically coupled between the seventh transistor and the voltage source, wherein a control end of the eighth transistor is electrically coupled to the output end of the device; and
at least one PODE device adjacent to a drain/source region of at least one of the second transistor, the third transistor, the sixth transistor, and the seventh transistor, wherein a control end of the at least one PODE device is electrically coupled to a drain/source end of the at least one of the second transistor, the third transistor, the sixth transistor, and the seventh transistor.

17. The device as claimed in claim 16, wherein a source end and a drain end of the PODE device is electrically coupled to each other.

18. The device as claimed in claim 16, wherein a source end and a drain end of the PODE device are electrically coupled to the control end of the PODE device.

19. The device as claimed in claim 16 further comprising:
a conductor configured to electrically connect a gate of the PODE device to the drain/source end of the at least one of the second transistor, the third transistor, the sixth transistor, and the seventh transistor.

20. The device as claimed in claim 16, wherein the first transistor, the second transistor, the fifth transistor, and the sixth transistor are N-type transistors, and the third transistor, the fourth transistor, the seventh transistor, and the eighth transistor are P-type transistors.

* * * * *